United States Patent [19]

Doucette

[11] 4,281,258

[45] Jul. 28, 1981

[54] HIGH SPEED, LOW COMPONENT COUNT, CML EXCLUSIVE NOR GATE

[75] Inventor: Richard L. Doucette, San Marcos, Calif.

[73] Assignee: Burroughs Corporation, Detroit, Mich.

[21] Appl. No.: 958,255

[22] Filed: Nov. 6, 1978

[51] Int. Cl.³ .................. H03K 19/21; H03K 19/082; H03K 19/20
[52] U.S. Cl. ................................. 307/455; 307/472; 328/93
[58] Field of Search .................. 307/215, 216; 328/93

[56] References Cited

U.S. PATENT DOCUMENTS 3,003,071  10/1961  Henle ................................ 307/216

FOREIGN PATENT DOCUMENTS 255358  3/1970  U.S.S.R. .................................. 307/216

Primary Examiner—John Zazworsky
Attorney, Agent, or Firm—Charles J. Fassbender; Joseph R. Dwyer; Kevin R. Peterson

[57] ABSTRACT

A high speed, low component count, exclusive NOR gate in one embodiment comprising two input transistors whose emitters are connected to the bases of a pair of cross-coupled transistors with the collectors of the latter being connected in common and forming the output of the gate so that the current flow through the emitter cross-coupled transistors is controlled by the base voltages of the two input transistors such that an exclusive NOR gate arrangement is provided. In another embodiment, a pair of Schottky diodes are disposed between the emitters of the input transistors and the cross-coupled emitter transistors to bias the bases of the latter and to change the input signal levels required.

7 Claims, 5 Drawing Figures

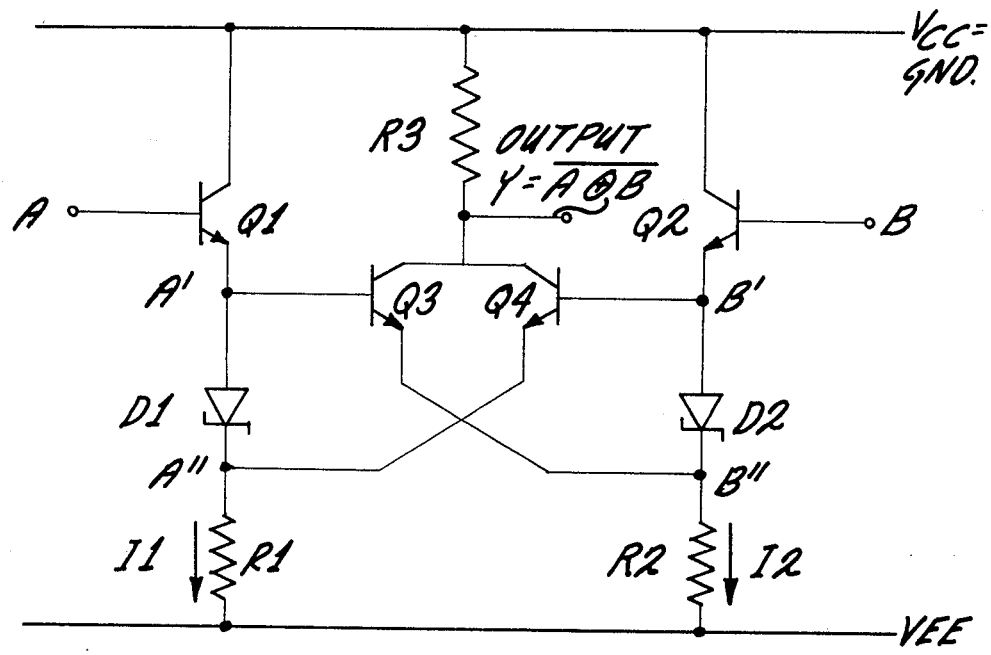
TRUTH TABLE
| A | B | Y |
|---|---|---|
| L | L | H |
| L | H | L |
| H | L | L |
| H | H | H |
Fig. 4
Fig. 5
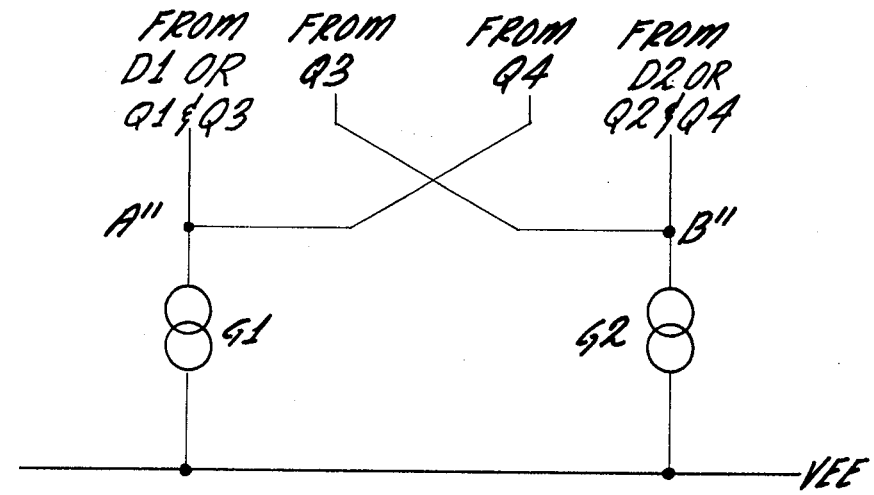

HIGH SPEED, LOW COMPONENT COUNT, CML EXCLUSIVE NOR GATE

BACKGROUND OF THE INVENTION

This invention relates to Current Mode Logic (CML) devices, and in particular to a high-speed, low component count, CML Exclusive NOR gate.

FIG. 1 illustrates an exclusive OR-NOR gate of the CML type, together with its truth table, which is a derivative of Emitter Coupled Logic (ECL), and which requires seven active elements and two threshold voltage sources VT-1 and VT-2.

FIG. 2 is a typical exclusive OR gate of the Transistor Transistor Logic (TTL), utilizing eleven active elements. When node $\overline{A}$ is HIGH, and node $\overline{B}$ is LOW, then transistor Q7 conducts, and the Y output is HIGH. When node $\overline{A}$ is LOW, and node $\overline{B}$ is HIGH, then transistor Q8 conducts, the Y output is HIGH. However, if both nodes $\overline{A}$ and $\overline{B}$ are either HIGH or LOW together, then neither transistor Q7 nor Q8 can conduct, and therefore the Y output is LOW. This operation is due to the cross coupled arrangement of transistors Q7 and Q8. Typical of TTL type circuitry, the voltage swings are greater than CML, the transistors saturate, and thus the speed of TTL is less than the speed of CML type logic devices.

It is recognized, therefore, that in LSI applications, there is a need for a minimum size exclusive OR function in the CML type circuitry, and it is, therefore, an object of this invention to provide a CML type exclusive NOR gate, which is faster and utilizes a lower number of active devices than in the prior art, and eliminates the need for additional threshold voltage sources as in the prior art.

SUMMARY OF THE INVENTION

The CML gate which accomplishes the foregoing objects comprises, in one embodiment, two input transistors whose emitters are connected to the bases of a pair of cross-coupled transistors with the collectors of the latter being connected in common and forming the output of the gate so that the current flow through the emitter cross-coupled transistors is controlled by the base voltages of the two input transistors such that an exclusive NOR gate arrangement is provided. In another embodiment, a pair of Schottky diodes are disposed between the emitters of the input transistors and the cross-coupled emitter transistors to bias the bases of the latter and to change the input signal levels required.

BRIEF DESCRIPTIONS OF THE DRAWINGS

FIG. 4 is a schematic diagram of a second embodiment of the simplified CML exclusive NOR gate comprising the present invention and a truth table therefor, and FIG. 5 is a schematic diagram of a different current source for either embodiment.

BRIEF DESCRIPTION OF THE PREFERRED EMBODIMENTS

Figure 3:
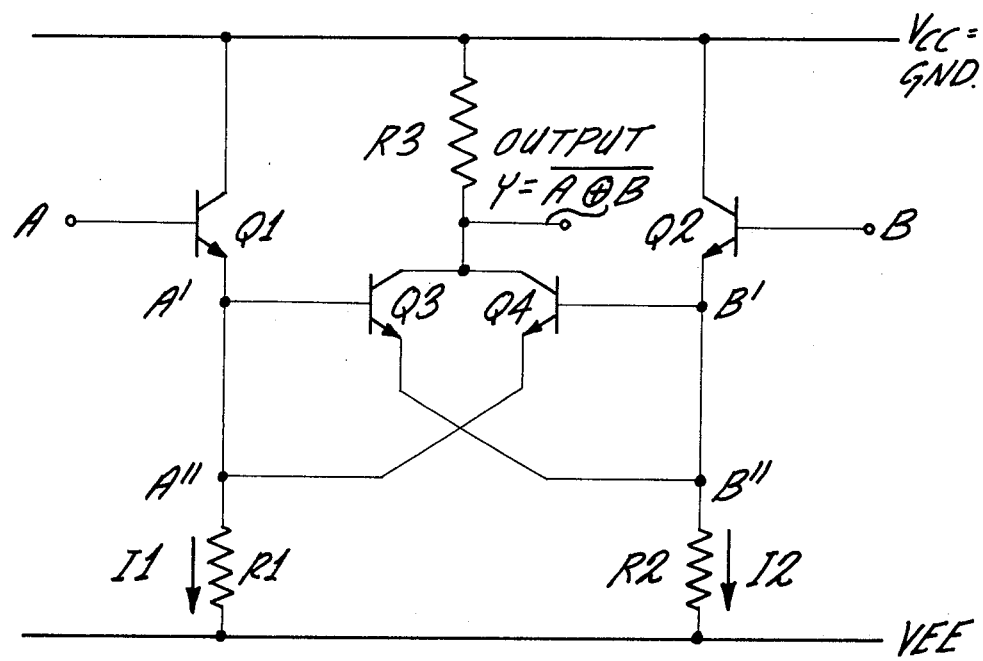
FIG. 3 is a schematic diagram of one embodiment of the simplified CML exclusive NOR gate comprising the present invention and a truth table therefor.

FIG. 3 illustrates the first embodiment the CML exclusive NOR gate of the present invention which comprises four NPN transistors Q1, Q2, Q3, and Q4 and three resistors R1, R2 and R3.

Input transistor Q1 has it collector connected to VCC (ground), and its base forming the input A, while its emitter is coupled at node A' to the base of transistor Q3, as well as to the voltage source VEE, through resistor R1.

Input transistor Q2 has its collector connected to VCC (ground), and its base forming the input B, while its emitter is connected at node B' to the base of transistor Q4 and to the voltage source VEE through resistor R2.

Transistor Q3 has its base connected to the emitter of transistor Q1 at node A', as mentioned previously, while its collector is connected in common to the collector of transistor Q4, and to the voltage source VCC (ground) through resistor R3. The emitter of transistor Q3 is coupled at node B" to the voltage source VEE through resistor R2.

Transistor Q4 has its base connected between the collector of transistor Q2 at node B', as previously mentioned, while its collector, also previously mentioned, is connected in common to the collector of transistor Q3 and to voltage reference source VCC (ground) through resistor R3. The emitter of transistor Q4 is connected at node A" to the voltage source VEE through resistor R1.

Thus it can be seen that the emitters of transistors Q3 and Q4 are cross-coupled to the emitters of transistors Q1 and Q2.

Finally, the Y output of the NOR gate is connected between the common connection of the collectors of transistors Q3 and Q4 and resistor R3.

It should be noted also that resistors R1 and R2 could be replaced with conventional constant current source generators. See FIG. 5.

The operation of the foregoing circuit is as follows. Assume that the transistors are designed such that their forward bias base-emitter voltage (VBE) is 800 mV. The logic swing is assumed to be 1000 mV with 0.0 V being HIGH and −1000 mV being LOW. If the inputs to A and B are LOW (−1000 mV), then current I1 flows through transistor Q1, and current I2 flows through transistor Q2. Therefore, the Y output is HIGH (0.0 V) because the voltage at node A" and node B" equals 1800 mV, thereby cutting OFF the base-emitter junctions of both transistors Q3 and Q4. Similarly, when the inputs to A and B are both HIGH (0.0 V), the voltage at A" and the voltage at node B" is −800 mV. Under these conditions transistors Q3 and Q4 are still OFF, and therefore, the output at Y is still HIGH. However, when A is HIGH (0.0 V), and B is LOW (−1000 mV), current I1 flows through transistor Q1 as before, but the current I2 flows through transistor Q3 at resistor R2 pulling the output Y LOW. The node A" voltage is −800 mV and node B" voltage is −1600 mV. Thus, transistors Q2 and Q4 are cut OFF. Due to the symmetry of the circuit, it is seen that the output Y is also LOW if A is LOW and B is HIGH. This is reflected in the a truth table accompanying FIG. 3.

Turning now to FIG. 4 which illustrates another embodiment of the invention in which two Schottky diodes D1 and D2 have been added, which allow reduced input logic savings.

Thus, input transistor Q1 has its collector connected to VCC (ground), and its base forming the input A, while its emitter is coupled at node A' to the base of transistor Q3, as well as to the voltage source VEE, through the first Schottky diode D1 and resistor R1.

Input transistor Q2 has its collector connected to VCC (ground), and its base forming the input B, while its emitter is connected at node B' to the base of transistor Q4 and to the voltage source VEE through the second Schottky diode D2 and resistor R2.

Transistor Q3 has its base connected to the emitter of transistor Q1 and to the anode of the Schottky diode D1 at node A', while its collector is connected in common to the collector of transistor Q4 and to the voltage source VCC (ground) through resistor R3. The emitter of transistor Q3 is coupled at node B'' between the cathode of the Schottky diode D2 and resistor R2.

Transistor Q4 has its base connected between the collector of transistor Q2 and the anode of the Schottky diode D2 at node B', while its collector, also previously mentioned, is connected in common to the collector of transistor Q3 and to voltage reference source VCC (ground) through resistor R3. The emitter of transistor Q4 is connected at node A'' between the cathode of the Schottky diode D1 and resistor R1.

Thus it can be seen that the emitters of transistors Q3 and Q4 are cross-coupled to the emitters of transistors Q1 and Q2, and the diodes D1 and D2 provide the base-emitter bias for transistor Q3 and Q4.

Finally, the Y output of the NOR gate is connected between the common connection of the collectors of transistors Q3 and Q4 and resistor R3.

It should be noted also that resistors R1 and R2 could be replaced with conventional constant current source generators. See FIG. 5.

The operation of this second embodiment is as follows. Assume that the transistors are designed such that their forward bias base-emitter voltage (VBE) is 800 mV. Also assume that the Schottky diodes are designed such that their forward bias voltage (VSD) is 600 mV. The logic swing is assumed to be 800 mV with 0.0 V being HIGH and −800 mV being LOW. If the inputs to A and B are LOW (−800 mV), then current I1 flows through the diode D1 and transistor Q1, and current I2 flows through the diode D2 and transistor Q2. Therefore, the Y output is HIGH (0.0. V) because the voltage at node A' and node B' equals −1600 mV and the voltage at node A'' and the voltage at node B'' equals −2200 mV, thereby cutting OFF the base-emitter junctions of both transistors Q3 and Q4 by 200 mV. Similarly, when the inputs to A and B are both HIGH (0.0 V), the voltage at node A' and the voltage at node B' is −800 mV and the voltage at node A'' and the voltage at node B'' is −1400 mV. Under these conditions transistors Q3 and Q4 are still OFF, and therefore, the output at Y is HIGH. However, when A is HIGH (0.0 V), and B is LOW (−800 mV), current I1 flows through diode D1 and transistor Q1 as before, but the current I2 flows through transistor Q3 and resistor R2 pulling the output Y LOW. The node A' voltage is −800 mV and node A'' voltage is −1400 mV, node B' voltage is −1000 mV, and node B'' voltage is −1600 mV. Due to the symmetry of the circuit it is seen that the output Y is also LOW if A is LOW and B is HIGH. This is reflected in the truth table.

Figure 1:
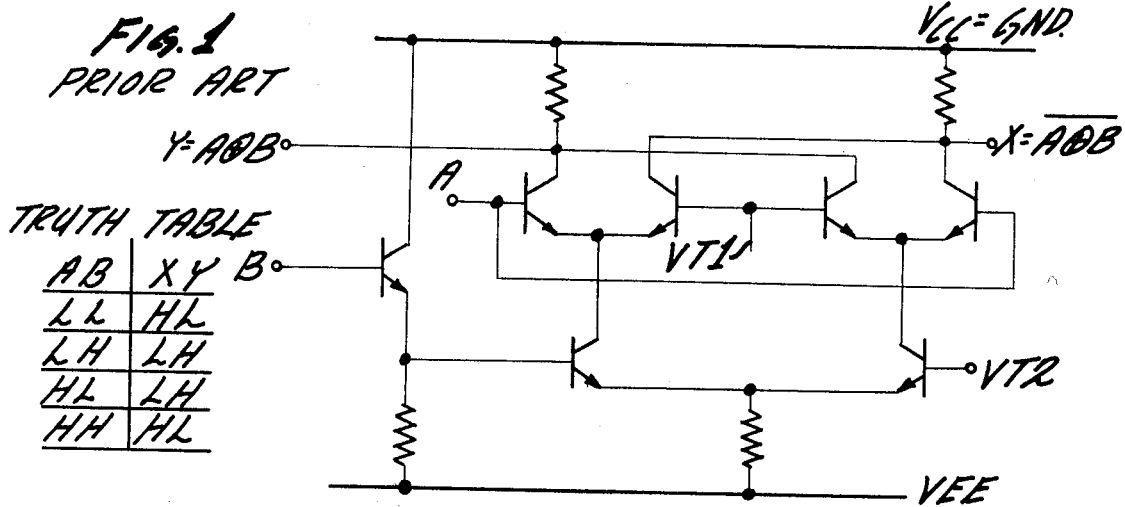
FIG. 1 is a typical prior art CML exclusive OR gate and truth table therefor.
Figure 2:
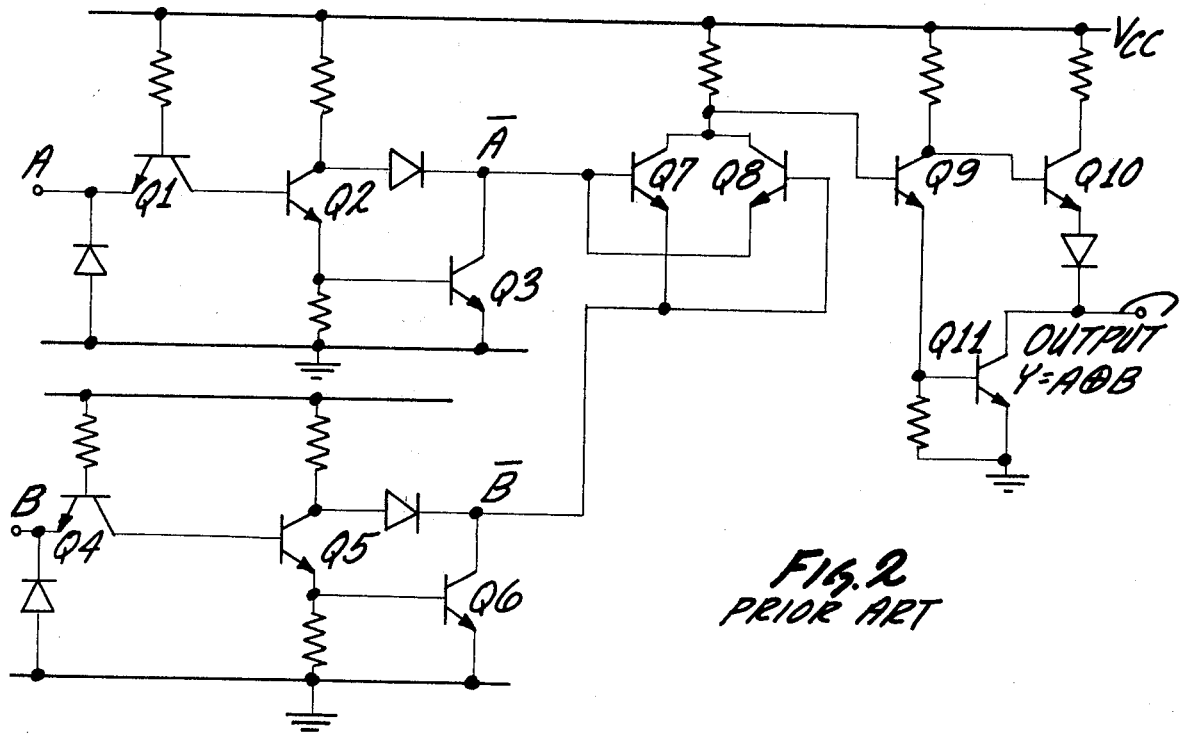
FIG. 2 is a prior art TTL exclusive OR gate.

Thus, in the foregoing there is disclosed two embodiments of a high speed, low component count CML exclusive NOR gate. Being CML, the operation of the gate is 5 to 6 times faster than the conventional TTL gate such as in FIG. 2, and with less active components than either the TTL gate or the CML gate of FIG. 1. Furthermore, the invention does not require the use of an additional threshold voltage generator as used by the CML gate of FIG. 1.

What is claimed is:

1. A CML exclusive NOR gate circuit comprising:
a first NPN transistor having a base, a collector and an emitter, said base serving as a first input to said gate,
a second NPN transistor having a base, a collector and an emitter, said base serving as a second input to said gate,
a third NPN transistor having a base, a collector and an emitter, the base of said third transistor being connected to the emitter of said first transistor,
a fourth NPN transistor having a base, a collector and an emitter, the base of said fourth transistor being connected to the emitter of said second transistor,
first and second diode means,
said first diode means being coupled between the emitter of the first transistor and the emitter of the fourth transistor,
said second diode means being coupled between the emitter of the second transistor and the emitter of the third transistor,
means for connecting the emitters of said third and fourth transistors to respective current sources, and for connecting the collectors of said first and second transistors to a reference voltage source,
resistance means,
means connecting the collectors of said third and fourth transistors together and to said reference voltage source through said resistance means, and
means forming an output connected between said resistance means at the collectors of said third and fourth transistors.

2. The NOR gate circuit as claimed in claim 1 wherein said first and second diode means are Schottky diodes.

3. An improved CML exclusive NOR gate circuit of the type having:
first, second, third, and fourth gain elements; each of said gain elements having a base, a collector, and an emitter;
means for coupling said collectors of said first, second, third, and fourth gain elements to a reference voltage, and for generating an exclusive NOR output signal in response to the current through said collectors of said third and fourth gain elements;
said bases of said first and second gain elements serving as respective inputs to said gate; said base of said third gain element being connected to said emitter of said first gain element; and said base of said fourth gain element being connected to said emitter of said second gain element; and
first and second current source means respectively coupled to said emitters of said third and fourth gain elements; wherein the improvement comprises:
a first biasing means for providing a base-emitter bias between said base of said third gain element and said emitter of said fourth gain element; and a second biasing means for providing a base-emitter bias between said base of said fourth gain element and said emitter of said third gain element.

4. An improved CML exclusive NOR gate circuit according to claim 3 wherein said first and second biasing means respectively consist of first and second diode means.

5. An improved CML exclusive NOR gate circuit according to claim 4 wherein said first and second diode means respectively consist of first and second Schottky diodes.

6. An improved CML exclusive NOR gate circuit according to claim 3 wherein said first, second, third, and fourth gain elements respectively consist of first, second, third and fourth bipolar transistors.

7. An improved CML exclusive NOR gate circuit according to claim 6 wherein said first, second, third, and fourth bipolar transistors are NPN bipolar transistors.

* * * * *